United States Patent [19]
Szczyrbowski

[11] Patent Number: 5,558,750
[45] Date of Patent: Sep. 24, 1996

[54] PROCESS AND SYSTEM FOR COATING A SUBSTRATE

[75] Inventor: J. Szczyrbowski, Goldbach, Germany

[73] Assignee: Leybold Aktiengesellschaft, Hanau, Germany

[21] Appl. No.: 392,700

[22] Filed: Feb. 23, 1995

[30] Foreign Application Priority Data

May 31, 1994 [DE] Germany ............ 44 18 906.0

[51] Int. Cl.$^6$ ............ C23C 14/34; C23C 14/35
[52] U.S. Cl. ............ 204/192.12; 204/298.22
[58] Field of Search ............ 204/192.12, 298.22, 204/298.26, 298.28

[56] References Cited

U.S. PATENT DOCUMENTS 4,443,318  4/1984  McKeley ............ 204/298.23
4,866,032  9/1989  Fujimori et al. ............ 505/476
5,215,638  6/1993  Häusler ............ 204/192.12
5,405,517  4/1995  Lampkin ............ 204/192.12

FOREIGN PATENT DOCUMENTS 2153861  5/1972  Germany.
4138926  6/1993  Germany.
4-210470  7/1992  Japan.

Primary Examiner—Aaron Weisstuch
Attorney, Agent, or Firm—Felfe & Lynch

[57] ABSTRACT

A coating system has, in a housing (1), a sputtering chamber (3) for the coating of a substrate (22) and a target carrier coating chamber (4) for the continuous coating of a rotating target carrier (2) with a coating of target material (25), which projects into both chambers (3, 4). The surface of the carrier which has been coated in the target carrier coating chamber (4) passes continuously through the sputtering chamber (3). The previously produced coating forms the target for the sputtering process in the sputtering chamber (3).

15 Claims, 1 Drawing Sheet

PROCESS AND SYSTEM FOR COATING A SUBSTRATE

BACKGROUND OF THE INVENTION

The invention pertains to a process for coating a substrate by means of a sputter cathode, which has a rotatable target carrier with a target in front of a magnet, in which process part of the target carrier projects into a sputtering chamber for the coating of the substrate and where another part projects into a target carrier coating chamber, so that the surface which has been coated in the target carrier coating chamber passes continuously through the sputtering chamber. In addition, the invention pertains to a coating system for the implementation of this process.

A process of the type described above is the object of U.S. Pat. No. 4,866,032. The component which serves as target carrier and target in the coating system described in this publication is designed as a circular disk, which rotates around a vertical axis; half of this component projects into a sputtering chamber, while the other half projects into a target carrier coating chamber. In the sputtering chamber, underneath the target, there is an array of magnets. A magnetron cathode is thus created there, which makes it possible to coat a large piece of foil economically. To be able to influence the properties of the coating system in spite of the use of one and the same target, two other targets are provided in the target carrier coating chamber, each of which has its own ion source. This makes it possible to deposit additional target material onto the main target in the target carrier coating chamber. As a result, this material can be atomized in the sputtering chamber together with the material of the main target, which is designed as a disk. In an alternative design, U.S. Pat. No. 4,866,032 states that a metal rod, the material of which can be vaporized to form a layer on the main target, can be provided in the target carrier coating chamber.

The sputtering process is the only coating process which makes it possible to produce usable layers economically on large surfaces. Only by this method is it possible to produce a layer of satisfactory uniformity over the large areas required for interference systems. For this reason, layer systems for architectural glass are produced almost exclusively by sputtering technology.

The sputtering process, however, suffers from serious disadvantages in comparison with other systems, especially thermal and chemical vapor deposition, arc vapor deposition, and electron beam vapor deposition. The disadvantages of the sputtering process include in particular the high price of the targets, the short service life of the targets, and the low degree of target utilization. The high price of targets is attributable to the cost of materials, to the cost of production, and to the cost of bonding. In many cases, the costs of production and bonding are much higher than the material costs. The service life of a flat target at the current sputtering rates is about 2 weeks. This means that sputtering systems must be shut down every two weeks and vented, so that the target can be replaced. An increase in the sputtering rates would shorten the periods between target replacements and therefore make little if any contribution to an increase in economy. In the case of flat magnetron cathodes, the degree of target utilization is currently about 25–30%. In the case of tubular cathodes, a target utilization of 70% can be achieved in practice.

The disadvantages of the sputtering process described above are also present in the coating system according to the above-cited U.S. Pat. No. 4,866,032. The system must be shut down at regular intervals so that the circular, disk-shaped, rotating target carrier with the target in the sputtering chamber and the additional targets in the target carrier coating chamber can be replaced with new targets or with the metal rod provided there. For this reason, continuous coating is possible only during a relatively short period of time.

SUMMARY OF THE INVENTION

The invention is based on the task of designing a coating process of the general type indicated above in such a way that the system required to implement it can be kept in operation, without interruption, for much longer periods of time. In addition, a coating system for implementing this process is also to be developed.

The first of the two tasks is accomplished by applying the target material to the target carrier by introducing source material into the target carrier coating chamber continuously from the outside and by using this coating on the target carrier exclusively as the target in the sputtering chamber.

In the process according to the invention, the target is produced continuously in the system by coating. The target which is sputtered is always the target which has just been produced beforehand. The layer forming the target can be applied very economically by means of a known process with less energy than that used for sputtering, and the layers can also be applied at high coating rates. According to the process of the invention, the layer produced on the electrode is then sputtered onto the substrate; this means that, even if the target layer produced on a large substrate is of irregular thickness, there is no disadvantage. Thanks to the invention, it is possible to produce large surfaces very uniformly with high economy and to operate the system for very long, uninterrupted periods of time. The process according to the invention combines the advantages of sputtering with those of other methods of layer production without suffering from the disadvantages of the individual coating processes on their own.

The process according to the invention can be carried out very economically by coating the target carrier by means of plasma-controlled chemical vapor deposition (PCVD).

The cost of the equipment for implementing the process according to the invention can be lowered significantly by using a common power-voltage supply for both the sputtering and for the coating of the target carrier.

According to another, especially advantageous embodiment of the invention, the layer produced on the target carrier can be converted by means of a chemical reaction into a form which leads to optimum sputtering results before it enters the sputtering chamber. To realize this idea, the area of the target carrier which has been coated in the target carrier coating chamber is conducted through a reaction chamber for the chemical treatment of the coating before this area enters the sputtering chamber. When, for example, electrically conductive $In_2O_3$ layers, doped with Sn (ITO), are being sputtered, it therefore becomes possible to partially oxidize the applied metallic indium and tin by introducing oxygen into the reaction chamber. The properties of layers produced by the sputtering of an oxide target are often better than those obtained by the sputtering of a metallic target. A metallic target, furthermore, is much cheaper than an oxide target.

In a coating system for the implementation of the process, the target carrier coating chamber is designed for the application of the target material to the target carrier by means of a source material introduced into the target carrier coating chamber continuously from the outside and the sputtering chamber is designed for sputtering a target formed exclusively by this target material.

With a system such as this, it is possible to coat large substrates very uniformly and at high coating rates, without the need to shut down the system at regular intervals to replace used-up targets. The coating system according to the invention exploits the advantages of sputtering as well as those of the other coating production methods, but avoids the various disadvantages of these coating processes.

The coating system can be designed in an especially simple and efficient manner if, in accordance with a further embodiment of the invention, the target carrier coating chamber is designed for coating by means of plasma-controlled chemical vapor deposition (PCVD).

Before the layer on the target carrier forming the target enters the sputtering chamber, it can be chemically modified and therefore optimized for layer deposition by sputtering, if, between the target carrier coating chamber and the sputtering chamber, a reaction chamber for the chemical treatment of the target produced on the target carrier by coating is provided before the entrance to the sputtering chamber.

It is an important aspect of the coating system according to the invention that the surface of target carrier passes continuously through the target carrier coating chamber and the sputtering chamber. For this purpose, the target carrier can be designed in different ways; for example, it can be in the form of a disk, as described in U.S. Pat. No. 4,866,032 cited above. The coating system can function in an especially advantageous manner for large-area substrates by designing the target carrier as a tubular body and by providing two separate magnets in it, opposite each other, to form closed magnetic tubes. One of these magnets faces the sputtering chamber, while the other faces the target carrier coating chamber. The magnetic field for the control of the PCVD process should be selected in such a way as to ensure the optimum target carrier coating rate.

Sputtering in the target carrier coating chamber can be easily prevented by providing the magnet for the sputtering chamber with a field strength much higher than that of the other magnet.

During sputtering, the material on the curved sides of the pit forming in the target is eroded more quickly than that on the level areas, because in some cases the sides of the pit are perpendicular to the axis of the cathode. This effect can be compensated when the target is applied in the target carrier coating chamber by designed the two magnets in the same way, so that, in terms of shape, similar magnetic fields are produced. As a result, therefore, more material is applied to the area of the curved sides in the target coating chamber.

The sputtering process and the application of the target can be carried out in such a way that each process is optimized by installing separate anodes in the sputtering chamber and in the target carrier coating chamber and by connecting the two anodes independently of each other to different positive potentials.

Because the processes which occur in the sputtering chamber and in the target carrier coating chamber are different, the gas atmospheres of two chambers are also different. This means that the passage of gas from one chamber to the other must be prevented. This can be easily achieved by providing a lock chamber connected to a vacuum pump on both sides of the target chamber coating chamber, i.e., between it and the sputtering chamber.

If the lock chamber situated in the direction of rotation of the target carrier serves simultaneously as the reaction chamber, then it is possible to subject the applied layer forming the target to a chemical treatment before it enters the sputtering chamber.

The invention allows numerous concrete embodiments. For further illustration of the basic principle of the invention, one of the embodiments is shown schematically in the drawing and explained in greater detail below.

DETAILED DESCRIPTION OF THE PREFERRED EMBODIMENT

Figure 1:
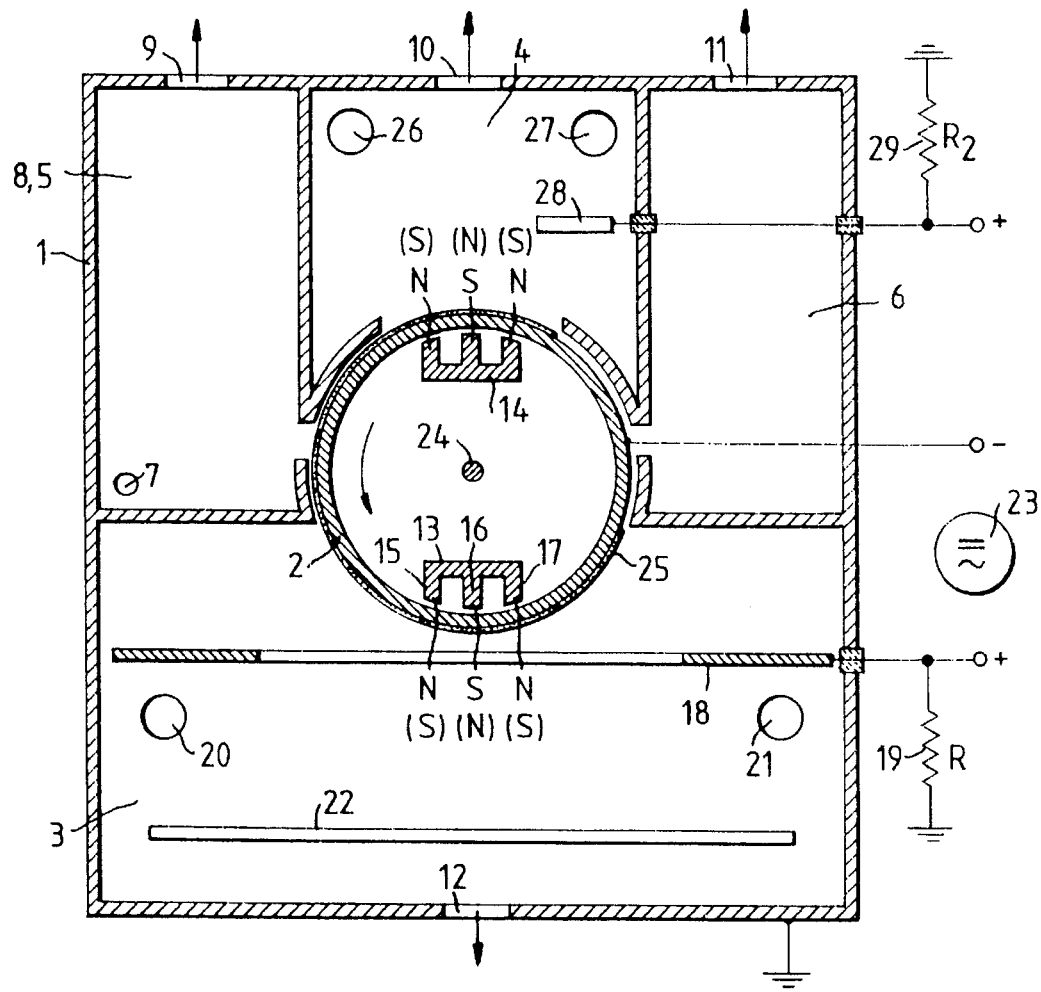
FIG. 1 shows a vertical section through a coating system according to the invention.

The coating system shown in FIG. 1 has a tubular target carrier 2 in a housing 1; one part of the outside lateral surface of this carrier forms a boundary of a sputtering chamber 3, and another part forms a boundary of a target carrier coating chamber 4, opposite the first chamber. Smaller partial areas of the outside lateral surface of target carrier 2 form boundaries of two lock chambers 5, 6, located on either side of target carrier coating chamber 4. Lock chamber 5 has a gas inlet 7, through which a reaction gas can be supplied, so that lock chamber 5 serves simultaneously as a reaction chamber 8. Sputtering chamber 3, target carrier coating chamber 4, and also the two lock chambers 5, 6 are connected by way of outlets 9, 10, 11, 12 to a vacuum pump (not shown).

Inside target carrier 2, opposite each other, a first magnet 13 and a second magnet 14 of the same shape extend over the length of target carrier 2. As illustrated by the reference numbers for magnet 13, the two magnets 13, 14 have ridges 15, 16, 17 pointing toward target carrier 2; the two ridges 15, 17 are connected to each other at their ends. Outer ridges 15, 17 are magnetized in such a way that they point toward target carrier 2 with the magnetic pole opposite that of ridge 16 located between them.

An anode 18, which is connected to ground by way of a resistor 19, is installed in sputtering chamber 3. In addition, sputtering chamber 3 has reaction gas inlets 20, 21. A substrate 22 to be coated is also shown in sputtering chamber 3.

Target carrier 2 is connected to the negative pole of a power-voltage supply 23. While the coating system is operating, the carrier 2 rotates in a counterclockwise direction around an axis 24 extending in its longitudinal direction. The strengths of magnets 13, 14 are selected. So that a coating of target material 25 attached to target carrier 2 is sputtered in sputtering chamber 3, but no sputtering occurs in target carrier coating chamber 4.

Target carrier coating chamber 4 has two gas inlets 26, 27, through which the material forming a coating of target material 25 is supplied continuously by means of a carrier gas. As a result, a conventional chemical vapor deposition process with plasma control (PCVD) takes place in target carrier coating chamber 4. For this purpose, an anode 28 is installed in target carrier coating chamber 4; this anode is connected to ground by way of a resistor 29. As a result of the rotation of target carrier 2, the layer which forms coating of target material 25 passes from target carrier coating chamber 4 first into reaction chamber 8, where it is chemically pretreated under the action of a reaction gas (e.g., oxygen), supplied through gas inlet 7. Only thereafter does the coating of target material 25 arrive in sputtering chamber 3, where it is eroded from target carrier 2 in the conventional manner by means of sputtering.

Lock chamber 6, coming next in the direction of rotation, prevents gas from sputtering chamber 3 from entering target carrier coating chamber 4.

Figure 2:
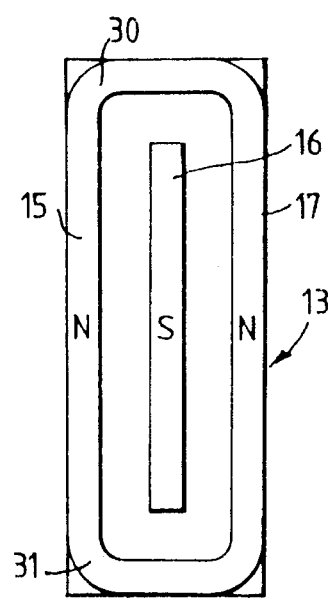
FIG. 2 shows a top view of the outside of a magnet for the coating system.

FIG. 2 shows the design of magnet 13. It can be seen that the end of one ridge 15, 17 is connected to the end of the other by an arc 30, 31, and that ridge 16 is between ridges 15, 17.

What is claimed is:

1. A process for coating a substrate, comprising:

providing a target carrier which carries a target in front of a magnet, said target carrier having a part which projects into a target carrier coating chamber and a part which projects into a sputtering chamber, rotating said target carrier so that the part which projects into the target carrier coating chamber passes continuously into the sputtering chamber thence back into the target carrier coating chamber, applying a coating of target material to the target carrier by introducing said target material into said target carrier coating chamber continuously from outside the coating chamber, said coating of target material serving exclusively as said target on said target carrier, and coating said substrate with said target material by sputtering said target in said sputtering chamber.

2. The process as in claim 1 wherein said coating of target material is applied to said carrier by plasma-controlled chemical vapor deposition.

3. The process as in claim 1 wherein a common power supply is provided for both applying said coating in said coating chamber and sputtering said target.

4. The process as in claim 1 wherein said target carrier further comprises a part which projects into a reaction chamber, said target carrier being rotated so that the part which projects into the coating chamber rotates continuously into the reaction chamber, thence into the sputtering chamber.

5. Apparatus for coating a substrate, comprising:

a target carrier coating chamber, a sputtering chamber, a rotatable target carrier having a part which projects into said target carrier coating chamber and a part which projects into said sputtering chamber, means for applying a coating of target material to said target carrier by introducing a target material into said target carrier coating chamber continuously from outside said target carrier coating chamber, and means for sputtering said coating of target material in said sputtering chamber.

6. Apparatus as in claim 5 wherein said means for applying a coating of target material comprises plasma controlled chemical vapor deposition means.

7. Apparatus as in claim 5 further comprising a reaction chamber between said target carrier coating chamber and said sputtering chamber, said rotatable target carrier having a part which projects into said reaction chamber, and means for chemically treating a part of said coating of target material in said reaction chamber before said part passes into said sputtering chamber.

8. Apparatus as in claim 7 wherein said means for chemically treating a part of said coating of target material comprises a reactive gas inlet for admitting a reactive gas to said reaction chamber.

9. Apparatus as in claim 5 wherein said target carrier comprises a tubular body, said apparatus further comprising first and second magnets inside said body, said first magnet forming a closed magnetic field over said body in said sputtering chamber, said second magnet forming a closed magnet field over said target in said target carrier coating chamber.

10. Apparatus as in claim 9, wherein said first magnet has a higher magnetic field strength than said second magnet.

11. Apparatus as in claim 9 wherein both magnets have the same geometric configuration.

12. Apparatus as in claim 5 wherein said means for applying a coating of target material comprises an anode in said target carrier coating chamber and said means for sputtering said coating of target material comprises an anode in said sputtering chamber, said anodes being connected independently of each other to different positive potentials.

13. Apparatus as in claim 5 further comprising a pair of lock chambers on opposite sides of said target carrier, each lock chamber being situated between the target carrier coating chamber and the sputtering chamber.

14. Apparatus as in claim 13 wherein one of said lock chambers is situated immediately downstream of said target carrier coating chamber in the direction of rotation and serves simultaneously as a reaction chamber where said coating of target material is chemically treated before passing into said sputtering chamber.

15. Apparatus as in claim 13 further comprising outlets for directly evacuating said lock chambers.

* * * * *